(12) United States Patent
Wang et al.

(10) Patent No.: US 11,064,633 B2
(45) Date of Patent: Jul. 13, 2021

(54) ELECTRICAL CONNECTOR

(71) Applicant: DONGGUAN LUXSHARE TECHNOLOGIES CO., LTD, Dongguan (CN)

(72) Inventors: XiaoKai Wang, Dongguan (CN); Zhen Luo, Dongguan (CN); BaiYu Duan, Dongguan (CN); XiaoPing Wu, Dongguan (CN)

(73) Assignee: DONGGUAN LUXSHARE TECHNOLOGIES CO., LTD, Dongguan (CN)

( * ) Notice: Subject to any disclaimer, the term of this patent is extended or adjusted under 35 U.S.C. 154(b) by 0 days.

(21) Appl. No.: 16/749,581

(22) Filed: Jan. 22, 2020

(65) Prior Publication Data

US 2021/0104837 A1 Apr. 8, 2021

(30) Foreign Application Priority Data

Oct. 8, 2019 (CN) .......................... 201921669765.9

(51) Int. Cl.
*H05K 7/20* (2006.01)
*H01R 13/518* (2006.01)

(52) U.S. Cl.
CPC ......... *H05K 7/2039* (2013.01); *H01R 13/518* (2013.01); *H05K 7/20336* (2013.01); *H05K 7/20418* (2013.01); *H05K 7/20436* (2013.01)

(58) Field of Classification Search
CPC .. G02B 6/4269; G02B 6/4268; G02B 6/4201; G02B 6/4261; G02B 6/4278; G02B 6/428; G02B 6/4284; G02B 6/3867; G02B 6/3879; G02B 6/3885; G02B 6/3897; G02B 6/4266; H01R 13/6594; H01R 12/721; H01R 24/60; H01R 12/712; H01R 13/659; H01R 12/722; H01R 13/533; H01R 13/6581; H01R 13/6582; H05K 7/20418; H05K 7/20509; H05K 7/20336;

(Continued)

(56) References Cited

U.S. PATENT DOCUMENTS 7,764,504 B2 * 7/2010 Phillips .............. H01R 13/6582
361/715
8,670,238 B2 * 3/2014 Wang ................... G02B 6/4269
361/716

(Continued)

*Primary Examiner* — Edwin A. Leon
*Assistant Examiner* — Matthew T Dzierzynski
(74) *Attorney, Agent, or Firm* — Birch, Stewart, Kolasch & Birch, LLP

(57) ABSTRACT

The present disclosure provides an electrical connector comprising an electrical connector housing, a partition part, a partition heat sink, a heat pipe, and a cooling module. The electrical connector housing comprised an upper surface, a lower surface, and two opposite sidewalls. The partition part is disposed in the electrical connector housing. The partition heat sink is disposed on the partition part and is disposed in the electrical connector housing. One end of the heat pipe is connected to the partition part. The cooling module is disposed at the outside the electrical connector housing and is connected to the other end of the heat pipe. The cooling efficiency is enhanced by conducting the heat of the partition heat sink to the outside of the electrical connector through a heat pipe to avoid heat accumulating in the electrical connector housing.

9 Claims, 6 Drawing Sheets

(58) Field of Classification Search
CPC .. H05K 7/20436; H05K 5/03; H05K 7/20154; H05K 7/20272; H05K 7/2039; H05K 7/20445; H05K 7/20781; H05K 7/20809; H05K 7/20818; H05K 9/0024; F28D 15/0275; F28D 15/0233; F28F 3/02; F28F 2275/085; F28F 3/06; F28F 9/001
See application file for complete search history.

(56) References Cited

U.S. PATENT DOCUMENTS

| | | | | |
|---|---|---|---|---|
| 9,518,785 | B2* | 12/2016 | Szczesny | G02B 6/4261 |
| 9,531,117 | B1* | 12/2016 | Yang | H01R 13/506 |
| 9,761,974 | B2* | 9/2017 | L'Esperance | G02B 6/4268 |
| 9,793,648 | B2* | 10/2017 | Regnier | F28F 3/02 |
| 9,910,231 | B2* | 3/2018 | Kelty | G02B 6/4269 |
| 9,960,525 | B2* | 5/2018 | Regnier | H05K 7/20509 |
| 10,367,283 | B2* | 7/2019 | L'Esperance | H01R 12/721 |
| 10,368,464 | B2* | 7/2019 | Chen | H05K 7/20272 |
| 10,446,960 | B2* | 10/2019 | Guy Ritter | H01R 13/6587 |
| 10,455,739 | B2* | 10/2019 | Su | H05K 7/20509 |
| 10,477,729 | B2* | 11/2019 | Han | H05K 7/20418 |
| 10,511,118 | B2* | 12/2019 | Beltran | H05K 3/00 |
| 10,551,580 | B2* | 2/2020 | Regnier | G02B 6/4278 |
| 10,555,437 | B2* | 2/2020 | Little | H01R 13/518 |
| 10,575,441 | B2* | 2/2020 | Hsu | H01R 12/721 |
| 10,581,210 | B2* | 3/2020 | Pogash | H01R 13/741 |
| 10,588,243 | B2* | 3/2020 | Little | H01R 24/60 |
| 2007/0236887 | A1* | 10/2007 | Cheng | H01L 23/427 |
| | | | | 361/700 |

* cited by examiner

ELECTRICAL CONNECTOR

CROSS REFERENCE TO RELATED APPLICATION

This application claims the priority benefit of Chinese Patent Application Serial Number 201921669765.9, filed on Oct. 8, 2019, the full disclosure of which is incorporated herein by reference.

BACKGROUND

Technical Field

The present disclosure relates to the technical field of electrical connector, and more particularly to an electrical connector.

Related Art

Electrical connectors are usually equipped with heat sinks, which conduct the heat generated during the operation of electrical connectors to the outside, avoiding the accumulation of heat and preventing the operation of connectors from being affected by the rising temperature. The conventional heat sinks installed within the electrical connector could not effectively conduct the heat generated by the electrical connector to the outside, resulting in an unpreferable cooling efficiency for the electrical connector.

SUMMARY

The embodiments of the present disclosure provide an electrical connector intended to solve the issue of low cooling efficiency of the electrical connector in which the heat sink within the electrical connector could not effectively conduct the heat to the outside.

The present disclosure provides an electrical connector comprising: an electrical connector housing comprising an upper surface, a lower surface, and two opposite sidewalls; a partition part disposed in the electrical connector housing; a partition heat sink disposed on the partition part and in the electrical connector housing; a heat pipe, one end of which is connected to the partition part; a cooling module disposed at the outside the electrical connector housing and connected to the other end of the heat pipe.

The embodiments of the present disclosure could enhance the cooling efficiency of the electrical connector by providing a heat pipe conducting the heat from the partition heat sink in the electrical connector housing to the outside, avoiding the accumulation of heat and preventing the operation of connectors from being affected by the rising temperature.

It should be understood, however, that this summary may not contain all aspects and embodiments of the present invention, that this summary is not meant to be limiting or restrictive in any manner, and that the invention as disclosed herein will be understood by one of ordinary skill in the art to encompass obvious improvements and modifications thereto.

BRIEF DESCRIPTION OF THE DRAWINGS

The features of the exemplary embodiments believed to be novel and the elements and/or the steps characteristic of the exemplary embodiments are set forth with particularity in the appended claims. The Figures are for illustration purposes only and are not drawn to scale. The exemplary embodiments, both as to organization and method of operation, may best be understood by reference to the detailed description which follows taken in conjunction with the accompanying drawings in which:

DETAILED DESCRIPTION OF THE EMBODIMENTS

Figure 1:
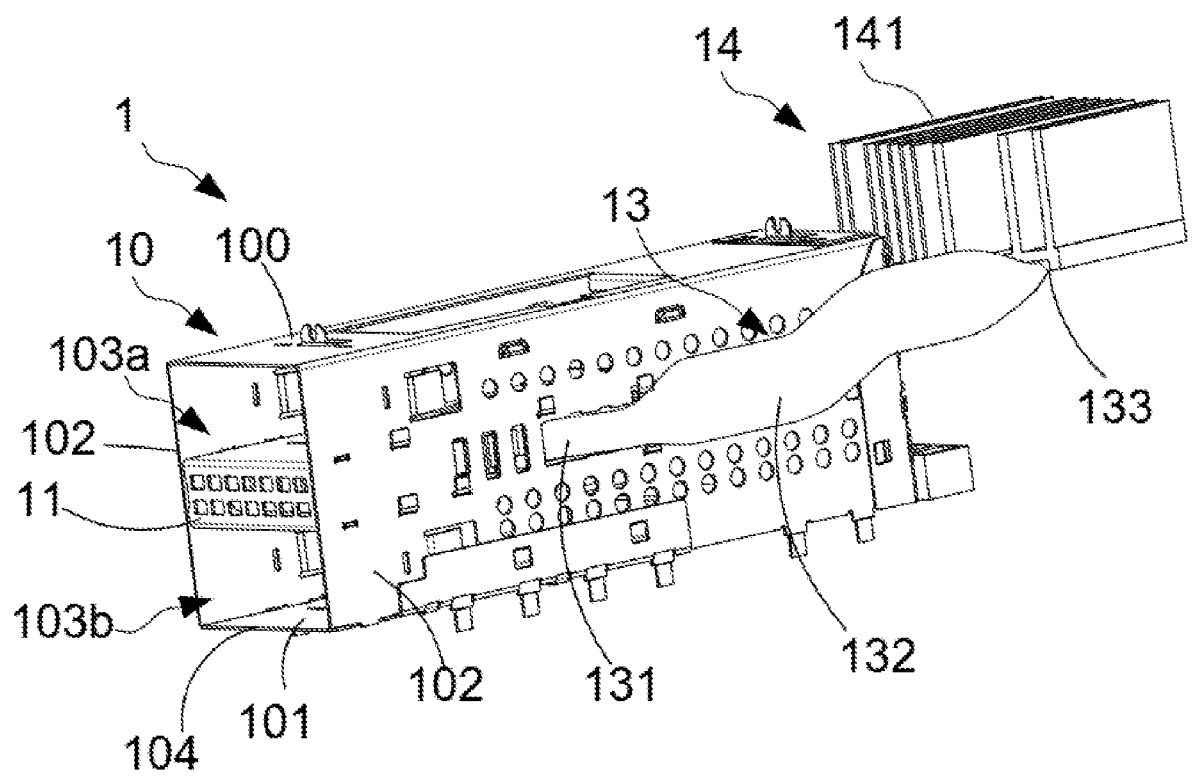
FIG. 1 is a perspective view of an electrical connector of the first embodiment of the present disclosure.

The present invention will now be described more fully hereinafter with reference to the accompanying drawings, in which exemplary embodiments of the invention are shown. This present invention may, however, be embodied in many different forms and should not be construed as limited to the embodiments set forth herein. Rather, these embodiments are provided so that this present invention will be thorough and complete, and will fully convey the scope of the present invention to those skilled in the art.

Certain terms are used throughout the description and following claims to refer to particular components. As one skilled in the art will appreciate, manufacturers may refer to a component by different names. This document does not intend to distinguish between components that differ in name but function. In the following description and in the claims, the terms "include/including" and "comprise/comprising" are used in an open-ended fashion, and thus should be interpreted as "including but not limited to". "Substantial/substantially" means, within an acceptable error range, the person skilled in the art may solve the technical problem in a certain error range to achieve the basic technical effect.

The following description is of the best-contemplated mode of carrying out the invention. This description is made for the purpose of illustration of the general principles of the invention and should not be taken in a limiting sense. The scope of the invention is best determined by reference to the appended claims.

Moreover, the terms "include", "contain", and any variation thereof are intended to cover a non-exclusive inclusion. Therefore, a process, method, object, or device that comprises a series of elements not only include these elements, but also comprises other elements not specified expressly, or may include inherent elements of the process, method, object, or device. If no more limitations are made, an element limited by "include a/an . . . " does not exclude other same elements existing in the process, the method, the article, or the device which comprises the element.

In the following embodiment, the same reference numerals are used to refer to the same or similar elements throughout the invention.

Figure 2:
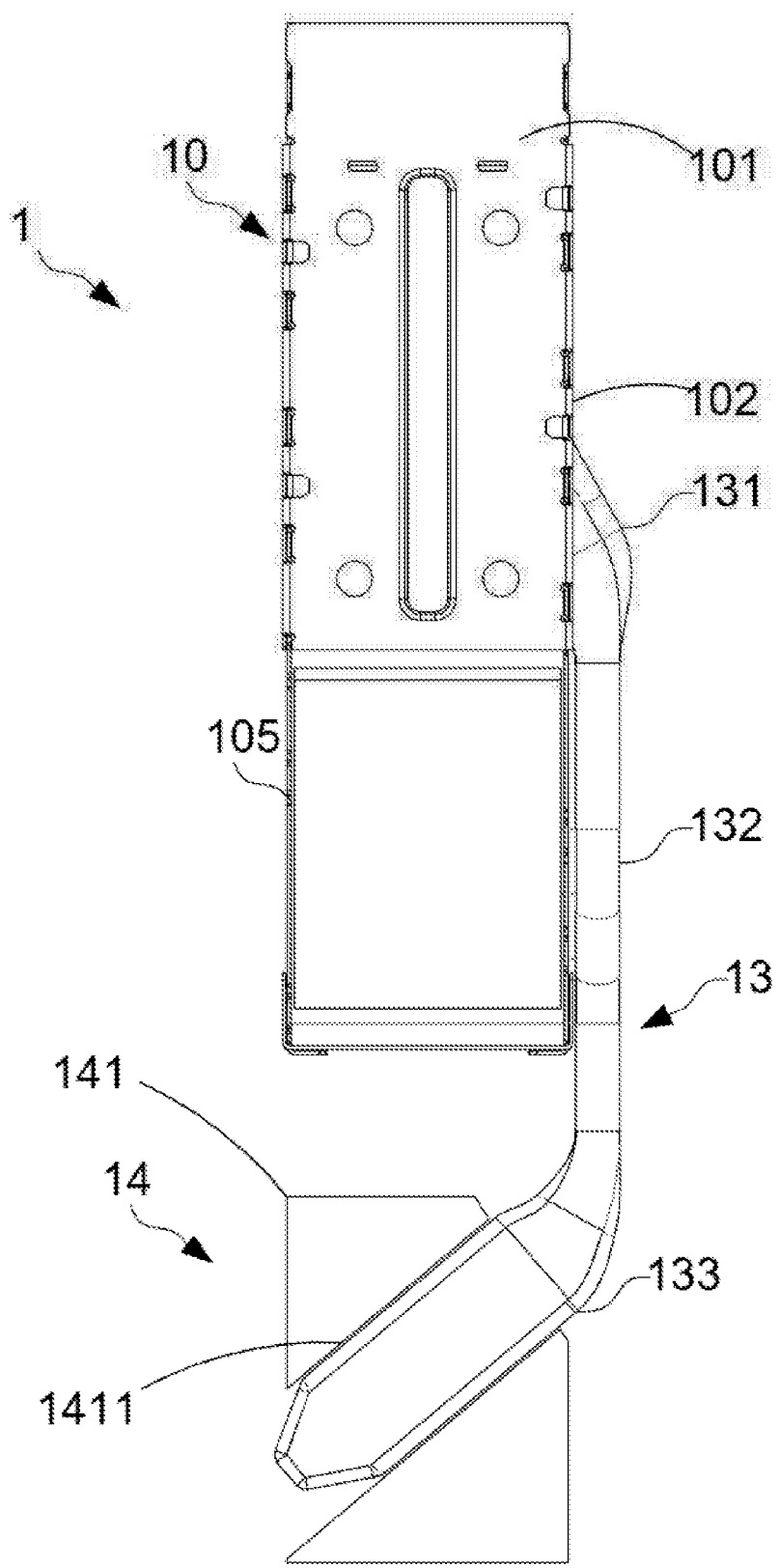
FIG. 2 is a schematic diagram of an electrical connector of the first embodiment of the present disclosure.
Figure 3:
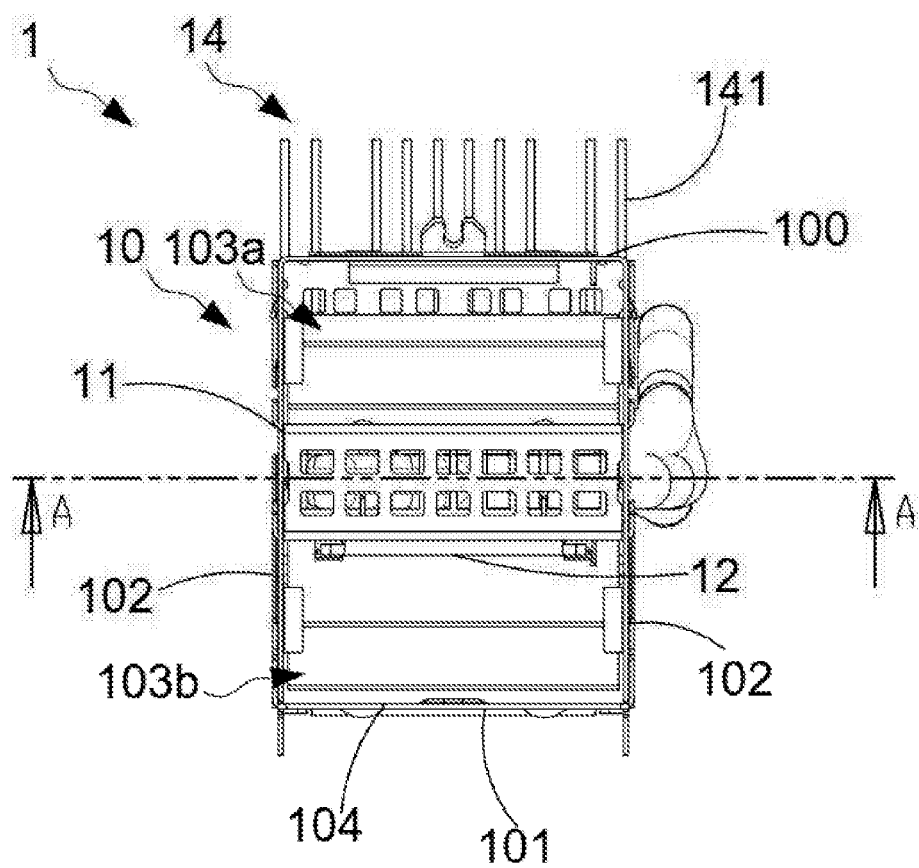
FIG. 3 is another schematic diagram of an electrical connector of the first embodiment of the present disclosure.

FIG. 1, FIG. 2 and FIG. 3 are a perspective view and schematic diagrams of an electrical connector of the first embodiment of the present disclosure. As shown in the figure, the electrical connector 1 of this embodiment comprises two electrical connector bodies (not shown), an electrical connector housing 10, a partition part 11, a partition heat sink 12, a heat pipe 13 and a cooling module 14. The electrical connector housing 10 comprises an upper surface 100, a lower surface 101, two opposite sidewalls 102, an accommodating space 103, a first opening 104, and a second opening 105. The first opening 104 is disposed at one end of the upper surface 100, the lower surface 101 and the two side walls 102. The second opening 105 is disposed on the lower surface 101 and is away from the first opening 104. This means that the end of the electrical connector housing 10 opposite to the first opening 104 is a closed-end. The partition part 11 is disposed in the electrical connector housing 10, and divides the accommodating space 103 of the electrical connector housing 10 into a first accommodating space 103*a* and a second accommodating space 103*b*. In this embodiment, the first accommodating space 103*a* and the second accommodating space 103*b* are arranged vertically. The first accommodating space 103*a* is disposed above the second accommodating space 103*b*. The second opening 105 is in communication with the first accommodating space 103*a* and the second accommodating space 103*b*. The first accommodating space 103*a* and the second accommodating space 103*b* accommodate connectors for docking.

Two electrical connector bodies are respectively disposed in the first accommodating space 103*a* and the second accommodating space 103*b*. The interface end of each electrical connector body corresponds to the first opening 104. The electrical connection end of each electrical connector body corresponds to the second opening 105. In this embodiment, the electrical connector 1 is a horizontal type electrical connector, so the second opening 105 would be disposed on the lower surface 101 of the electrical connector housing 10. The electrical connector 1 may also be a vertical type electrical connector, so the second opening 105 could be disposed on one end of the electrical connector housing 10 opposite to the first opening 104.

The partition heat sink 12 is disposed on the partition part 11 to cool down the electrical connector body disposed in the electrical connector housing 10. One end of the heat pipe 13 is connected to the partition heat sink 12, and the other end is connected to the cooling module 14. In this embodiment, one end of the heat pipe 13 passes through a sidewall 102 of the electrical connector housing 10 and enters the internal space of the electrical connector housing 10 to be connected to the partition heat sink 12. The cooling module 14 of this embodiment comprises a first heat sink 141 disposed at the outside of the electrical connector housing 10 and is provided separately from the electrical connector housing 10.

When the electrical connector 1 is being used, the heat generated by the two electrical connector bodies is conducted to the partition heat sink 12, which conducts the heat to the first heat sink 141 disposed at the outside of the electrical connector housing 10 through the heat pipe 13. In this way, the heat conducted to the partition heat sink 12 could be passed to the outside of the electrical connector housing 10 rapidly to reduce the internal temperature of the electrical connector 1.

Figure 4:
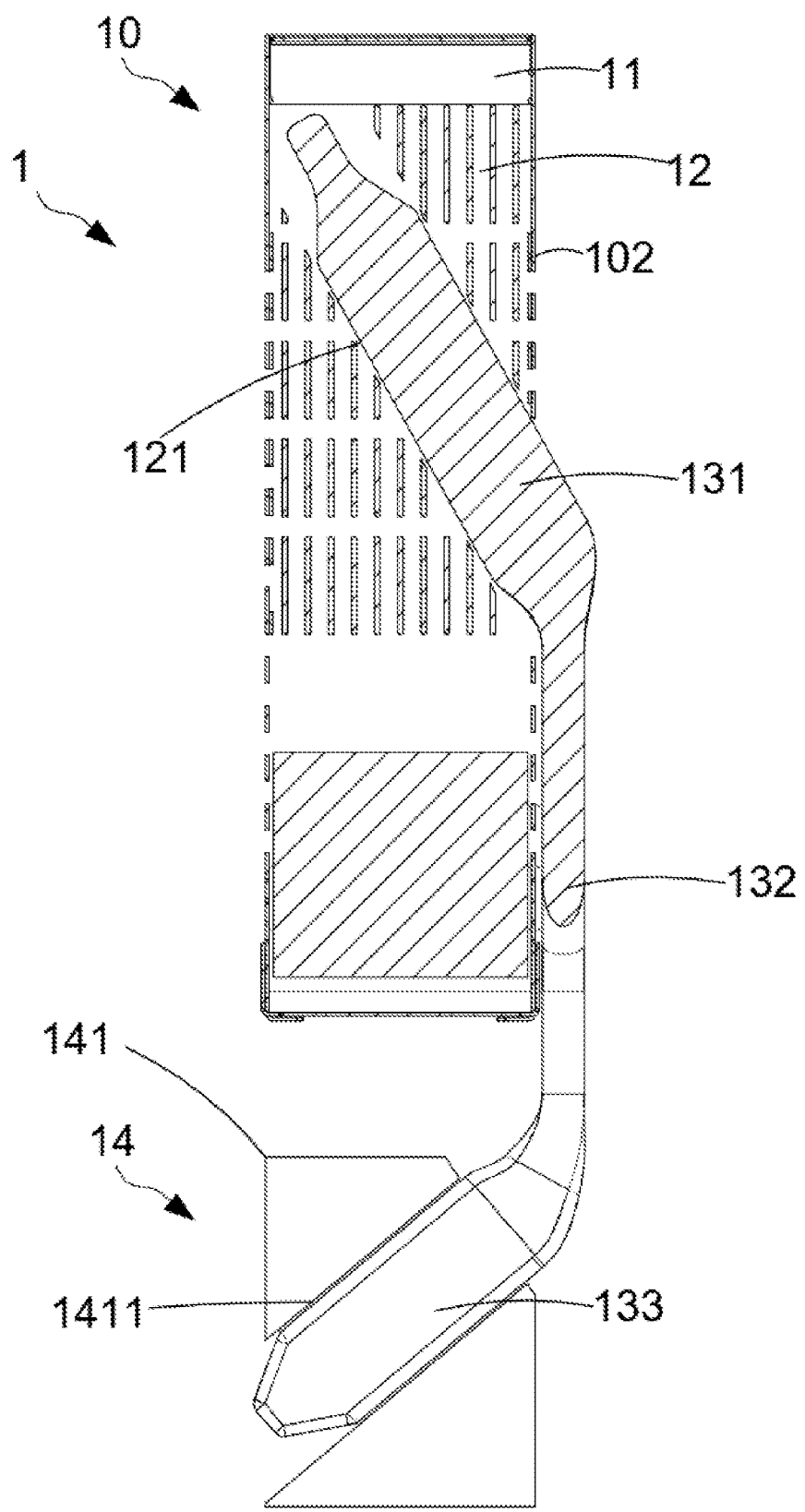
FIG. 4 is a cross-sectional view along the AA direction in FIG. 3.

FIG. 4 is a cross-sectional view along the AA direction in FIG. 3. As shown in the figure, the heat pipe 13 of this embodiment comprises a first internal connecting part 131, an external connecting part 132, and a second internal connecting part 133. The external connecting part 132 is disposed between the first inner connecting part 131 and the second inner connecting part 133. The partition heat sink 12 comprises a first connecting groove 121. The first heat sink 141 comprises a second connecting groove 1411. The first internal connecting part 131 is disposed in the first connecting groove 121. The second internal connecting part 133 is disposed in the second connecting groove 1411.

The width of a surface of the first internal connecting part 131 parallel to the upper surface 100 of the electrical connector housing 10 is greater than the height of a surface of the first internal connecting part 131 perpendicular to the upper surface 100 of the electrical connector housing 10. The width of a surface of the second internal connecting part 133 parallel to the upper surface 100 of the electrical connector housing 10 is greater than the height of a surface of the second inner connecting part 133 perpendicular to the upper surface 100 of the electrical connector housing 10. Thus, the shape of the first inner connecting part 131 and the second inner connecting part 133 are apparently horizontal flat. The width of the surface of the external connecting part 132 parallel to the upper surface 100 of the electrical connector housing 10 is smaller than the height of the surface of the external connecting part 132 perpendicular to the upper surface 100 of the electrical connector housing 10, forming a shape of vertical flat appearance. Therefore, the first internal connecting part 131 and the second connecting part 133 would not respectively occupy the vertical space of the partition heat sink 12 and the first heat sink 141 when respectively disposing in the partition heat sink 12 and the first heat sink 141; the external connecting part 132 would not occupy the horizontal space outside the electrical connector housing 10 when disposing along the edge of the electrical connector housing 10, to minimize the volume of the electrical connector 1. In addition, the flattened heat pipe 13 would also increase the cooling area when it is in contact with the partition heat sink 12 and the first heat sink 141 to enhance the cooling efficiency of the electrical connector 1.

The extending direction of the external connecting part 132 is parallel to the length direction 102 of the electrical connector housing 10. The first internal connecting part 131 and the second internal connecting part 133 are respectively inclined to the external connecting part 132, which means the first internal connecting part 131 and the second internal connecting part 133 are respectively inclined to the sidewalls 102 of the electrical connector housing 10. That is, the first internal connecting part 131 and the second internal connecting part 133 are not respectively parallel to the sidewalls 102 of the electrical connector housing 10, and extend into the partition heat sink 12 and the first heat sink 141, making the first inner connecting part 131 and the partition heat sink 12 arranged at an oblique angle contact, and the second inner connecting part 133 and the first heat sink 141 are arranged at an oblique angle contact. In this way, the contact area between the heat pipe 13 and the partition heat sink 12 and the first heat sink 141 could be increased, and thus the cooling efficiency of the electrical connector 1 would be enhanced.

The first heat sink 141 of this embodiment is provided separately from the electrical connector housing 10, and it is disposed at the outside of the electrical connector housing 10. The first heat sink 141 can also be optionally disposed on the upper surface 100 of the electrical connector housing 10. Thus, not only the heat of the partition heat sink 12 but also that of the electrical connector 1 would be released by the first heat sink 141, which increases the cooling efficiency of the electrical connector 1.

Figure 5:
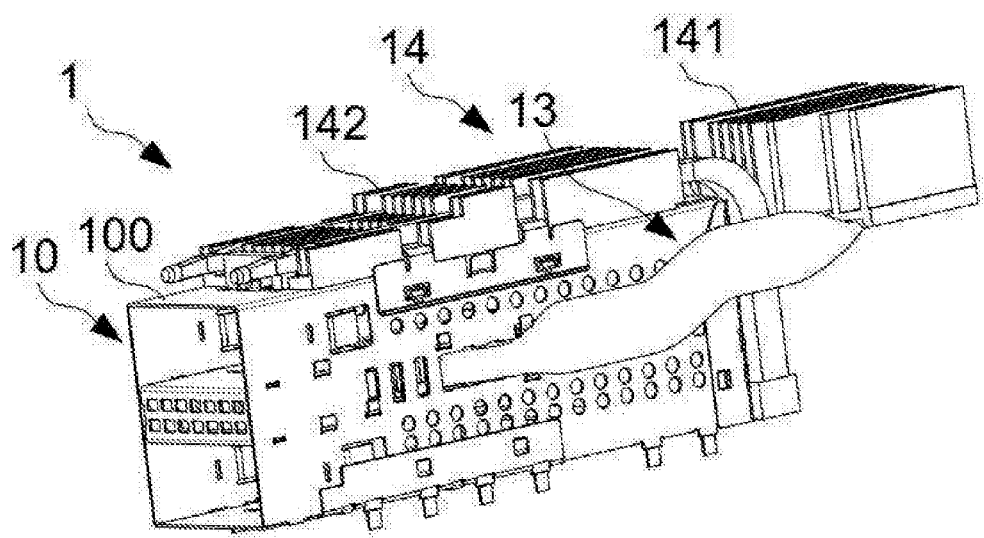
FIG. 5 is a perspective view of a cooling module of the second embodiment of the present disclosure.
Figure 6:
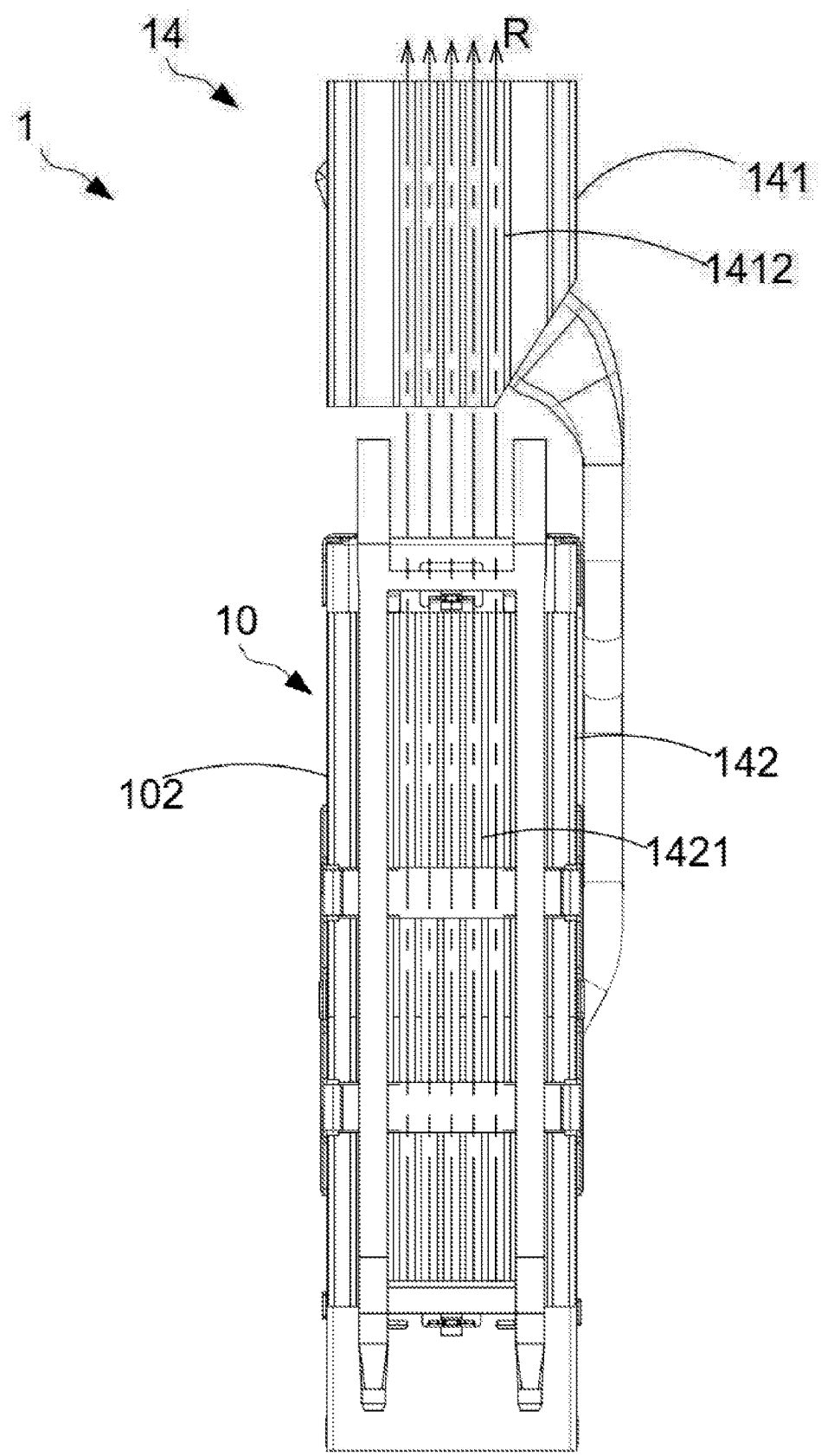
FIG. 6 is a schematic diagram of an electrical connector of the second embodiment of the present disclosure.

FIG. 5 and FIG. 6 are a perspective view and a schematic diagram of a cooling module of the second embodiment of the present disclosure. As shown in the figures, the electrical connector 1 of this embodiment is different from that of the first embodiment in that the cooling module 14 of this embodiment further comprises a second heat sink 142 disposed on the upper surface 100 of the electrical connector housing 10. The first heat sink 141 comprises a plurality of first cooling channels 1412. The second heat sink 142 comprises a plurality of second cooling channels 1421. The extending direction of the first cooling channel 1412 is identical to the extending direction of the second cooling channel 1421. In this embodiment, the extension direction of the first cooling channel 1412 and the extension direction of the second cooling channel 1421 are both parallel to the sidewalls 102 of the electrical connector housing 10. In another embodiment, the first cooling channel 1412 corresponds to the second cooling channel 1421. The first cooling channel 1412 and the second cooling channel 1421 are linearly arranged on the same line. In this embodiment, the vertical distance between the bottom surface of the first heat sink 141 and the lower surface 101 of the electrical connector housing 10 is equal to the height of the sidewalls 102 of the electrical connector housing 10. The vertical distance between the bottom surface of the first heat sink 141 and the lower surface 101 of the electrical connector housing 10 may also be shorter than or longer than the height of the sidewalls 102 of the electrical connector housing 10, as long as the first cooling channel 1412 and the second cooling channel 1421 are arranged on the same linear thermal conduction pathway R. Therefore, the cooling efficiency of the electrical connector 1 would be enhanced as the heat of the first cooling channel 1412 and the second cooling channel 1421 on the same linear thermal conduction pathway R can dissipate when airflow passes through the cooling module 14.

The partition heat sink 12, the first heat sink 141, and the second heat sink 142 of the present disclosure may be finned type or stacked type heat sinks. The partition heat sink 12, the first heat sink 141, and the second heat sink 142 in the above embodiments are described as finned type heat sinks for example.

In summary, the present disclosure provides an electrical connector effectively enhancing the cooling efficiency by rapidly conducting the heat of the partition heat sink to the outside of the electrical connector through the heat pipe connected to the partition heat sink in the electrical connector housing, avoiding heat accumulating in the electrical connector housing that affects the operation of the electrical connector. The cooling efficiency of the electrical connector is also enhanced by the flattened heat pipe reducing the requiring of the internal and external spaces for the electrical connector housing to minimize the volume of the electrical connector and to increase the cooling area. Moreover, the heat pipe is respectively arranged at an oblique angle with the partition heat sink and the first heat sink, which increases the contact area between the heat pipe and the partition heat sink and the contact area between the heat pipe and the first heat sink. Therefore, the cooling efficiency of the electrical connector could be further enhanced.

It is to be understood that the term "comprises", "comprising", or any other variants thereof, is intended to encompass a non-exclusive inclusion, such that a process, method, article, or device of a series of elements not only include those elements but also comprises other elements that are not explicitly listed, or elements that are inherent to such a process, method, article, or device. An element defined by the phrase "comprising a . . . " does not exclude the presence of the same element in the process, method, article, or device that comprises the element.

Although the present invention has been explained in relation to its preferred embodiment, it does not intend to limit the present invention. It will be apparent to those skilled in the art having regard to this present invention that other modifications of the exemplary embodiments beyond those embodiments specifically described here may be made without departing from the spirit of the invention. Accordingly, such modifications are considered within the scope of the invention as limited solely by the appended claims.

What is claimed is:

1. An electrical connector, comprising:
   an electrical connector housing comprising an upper surface, a lower surface, and two opposite sidewalls;
   a partition part disposed in the electrical connector housing;
   a partition heat sink disposed on the partition part and disposed in the electrical connector housing;
   a heat pipe having one end connected to the partition part, wherein the heat pipe comprises a first internal connecting part, an external connecting part, and a second internal connecting part, the external connecting part is disposed between the first internal connecting part and the second internal connecting part, the first internal connecting part is connected to the partition heat sink, and the external connecting part is disposed at the outside of the electrical connector housing; and
   a cooling module disposed at the outside the electrical connector housing and connected to the other end of the heat pipe, wherein the cooling module comprises a first heat sink, the first heat sink is connected to the heat pipe, and the second internal connecting part is connected to the first heat sink,
   wherein the width of a surface of the first internal connecting part parallel to the upper surface of the electrical connector housing is greater than the height of a surface of the first internal connecting part perpendicular to the upper surface of the electrical connector housing, and the width of a surface of the second internal connecting part parallel to the upper surface of the electrical connector housing is greater than the height of a surface of the second inner connecting part perpendicular to the upper surface of the electrical connector housing, and
   wherein the width of a surface of the external connecting part parallel to the upper surface of the electrical connector housing is smaller than the height of a surface of the external connecting part perpendicular to the upper surface of the electrical connector housing.

2. The electrical connector according to claim 1, wherein the first heat sink is disposed at the outside of the electrical connector housing, and the first heat sink is separated from the electrical connector housing.

3. The electrical connector according to claim 2, wherein the cooling module further comprises a second heat sink disposed on the upper surface of the electrical connector housing.

4. The electrical connector according to claim 1, wherein the first heat sink is disposed on the upper surface of the electrical connector housing.

5. The electrical connector according to claim 2, wherein the partition heat sink comprises a first connecting groove, and the first internal connecting part is disposed in the first connecting groove.

6. The electrical connector according to claim 2, wherein the first heat sink comprises a second connecting groove, and the second internal connecting part is disposed in the second connecting groove.

7. The electrical connector according to claim 2, wherein the first internal connecting part is inclined to the sidewalls of the electrical connector housing, and the second internal connecting part is inclined to the sidewalls of the electrical connector housing.

8. The electrical connector according to claim 3, wherein the first heat sink comprises a plurality of first cooling channels; the second heat sink comprises a plurality of second cooling channels, and the extension direction of the plurality of first cooling channels is identical to the extension direction of the plurality of second cooling channels.

9. The electrical connector according to claim 8, wherein the plurality of first cooling channels respectively correspond to the plurality of second cooling channels, and each first cooling channel and the corresponding second cooling channel are disposed on the same linear thermal conduction pathway.

\* \* \* \* \*